United States Patent
Kameyama

(10) Patent No.: US 9,448,109 B2
(45) Date of Patent: Sep. 20, 2016

(54) ANALOG-TO-DIGITAL CONVERSION CIRCUIT, IMAGING APPARATUS AND IMAGING SYSTEM

(71) Applicant: CANON KABUSHIKI KAISHA, Tokyo (JP)

(72) Inventor: Hiroaki Kameyama, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/869,326

(22) Filed: Sep. 29, 2015

(65) Prior Publication Data

US 2016/0116333 A1    Apr. 28, 2016

(30) Foreign Application Priority Data

Oct. 27, 2014  (JP) .................................. 2014-218589

(51) Int. Cl.
*H03M 1/56*     (2006.01)
*G01J 1/44*     (2006.01)
*H03M 1/12*     (2006.01)

(52) U.S. Cl.
CPC ....... *G01J 1/44* (2013.01); *H03M 1/56* (2013.01); *H03M 1/123* (2013.01)

(58) Field of Classification Search
CPC ......... H04N 5/335; H03M 1/12; H03M 1/56
USPC ........ 341/155, 169, 170, 159, 144; 348/243, 348/302
See application file for complete search history.

(56) References Cited

U.S. PATENT DOCUMENTS

| 8,848,079 B2 | 9/2014 | Itano et al. | |
|---|---|---|---|
| 2008/0170137 A1* | 7/2008 | Matsumoto | H04N 5/347 348/241 |
| 2010/0245639 A1* | 9/2010 | Mori | H04N 5/374 348/294 |
| 2011/0080507 A1* | 4/2011 | Iwasa | H04N 5/378 348/302 |

FOREIGN PATENT DOCUMENTS

JP            2013-93837 A       5/2013

* cited by examiner

*Primary Examiner* — Peguy Jean Pierre
(74) *Attorney, Agent, or Firm* — Fitzpatrick, Cella, Harper & Scinto

(57) ABSTRACT

An analog-to-digital conversion circuit includes: a plurality of comparators comparing an analog signal with a reference signal; a counter generating a count signal having a plurality of bits in Gray code; a plurality of first signal wirings each transmitting one of bits of the count signal from the counter to the plurality of memories each having a plurality of bit memories; and a plurality of second signal wirings, each connecting between the bit memories of the plurality of memories. Each of the second signal wirings is connected to one of the plurality of first signal wirings, and the first signal wirings and/or the second signal wirings include a signal wiring transmitting a signal of least significant bit in the count signal arranged between the plurality of other signal wirings each transmitting a signal of a bit different from the least significant bit in the count signal.

11 Claims, 8 Drawing Sheets

ANALOG-TO-DIGITAL CONVERSION CIRCUIT, IMAGING APPARATUS AND IMAGING SYSTEM

BACKGROUND OF THE INVENTION

1. Field of the Invention

The present invention relates to an analog-to-digital conversion circuit, an imaging apparatus and an imaging system.

2. Description of the Related Art

An analog-to-digital conversion circuit is known that has a plurality of comparators and a plurality of memories each of which is provided so as to correspond to each of the plurality of comparators (see Japanese Patent Application Laid-Open No. 2013-093837). Each of the plurality of comparators supplies a count signal value in a period during which signal levels of an analog signal and a reference signal have been compared, to a memory that is provided so as to correspond to each of the comparators.

In Japanese Patent Application Laid-Open No. 2013-093837, a difference in delay time between bits of count signals which are input to memories has not been investigated.

An object of the present invention is to provide an analog-to-digital conversion circuit which can reduce a difference in the delay time between the bits of digital signals which are input to memories; an imaging apparatus; and an imaging system.

SUMMARY OF THE INVENTION

According to an aspect of the present invention, an analog-to-digital conversion circuit comprises: a plurality of comparators, each configured to output a comparing result signal indicating a result of comparing an analog signal with a reference signal having a signal level changing with elapse of time; a plurality of memories, each arranged correspondingly to one of the plurality of comparators; a counter configured to generate a count signal having a plurality of bits in Gray code by counting a clock signal; and a plurality of first signal wirings, each configured to transmit one of the plurality of bits of the count signal from the counter to the plurality of memories, wherein each of the plurality of memories holds the count signal according to a signal level change of the comparing result signal of corresponding one of the plurality of comparators, to convert the analog signal to a digital signal, and wherein each of the plurality of memories has a plurality of bit memories, each storing one bit of the plurality of bits, the analog-to-digital conversion circuit further comprises a plurality of second signal wirings, each connecting between the bit memories of the plurality of memories, each of the plurality of second signal wirings is connected to one of the plurality of first signal wirings, and the plurality of first signal wirings and/or the plurality of second signal wirings include a signal wiring transmitting a signal of least significant bit in the count signal arranged between the other signal wirings each transmitting a signal of a bit different from the least significant bit in the count signal.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
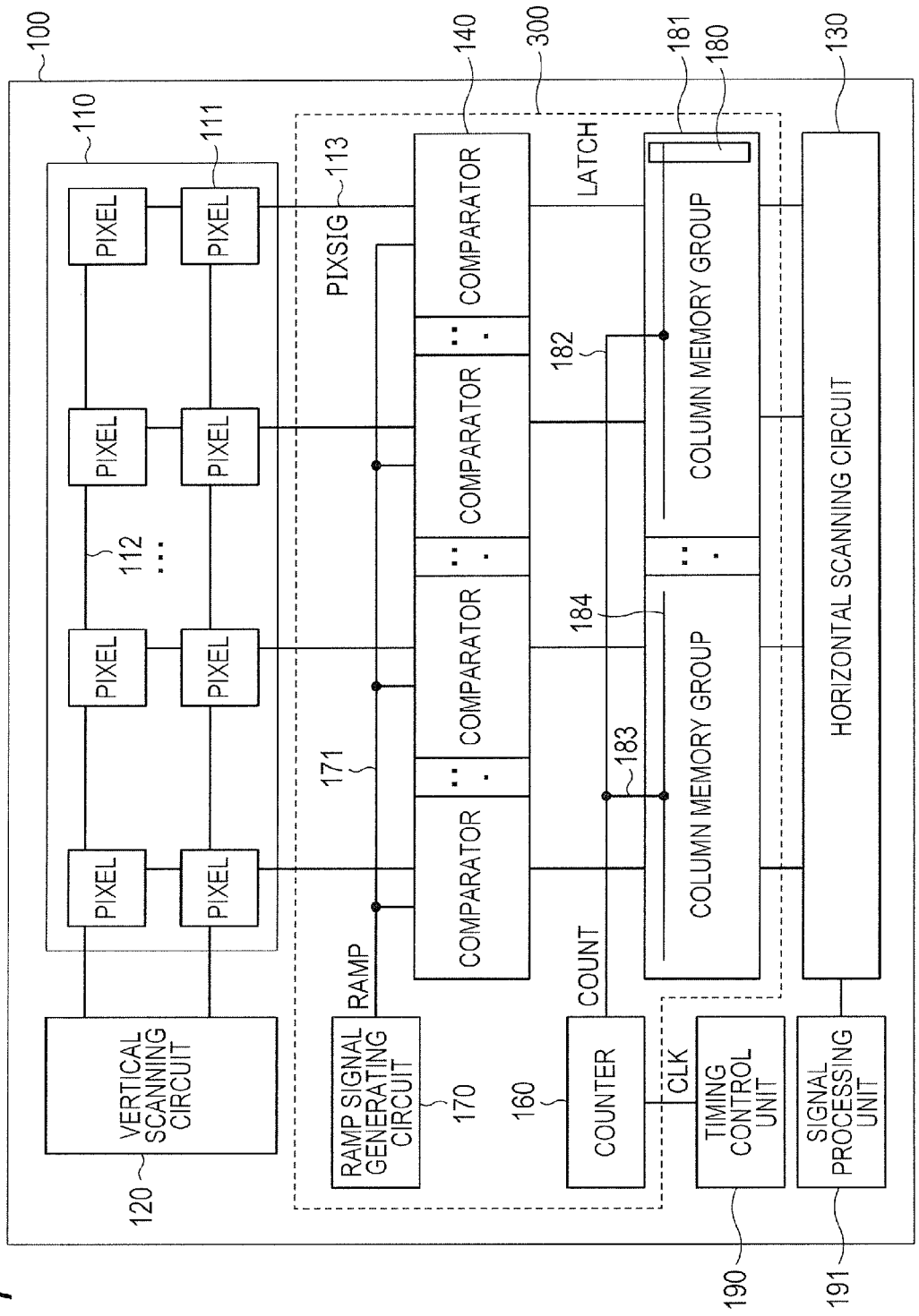
FIG. 1 is a view illustrating one example of a configuration of an imaging apparatus.
Figure 2:
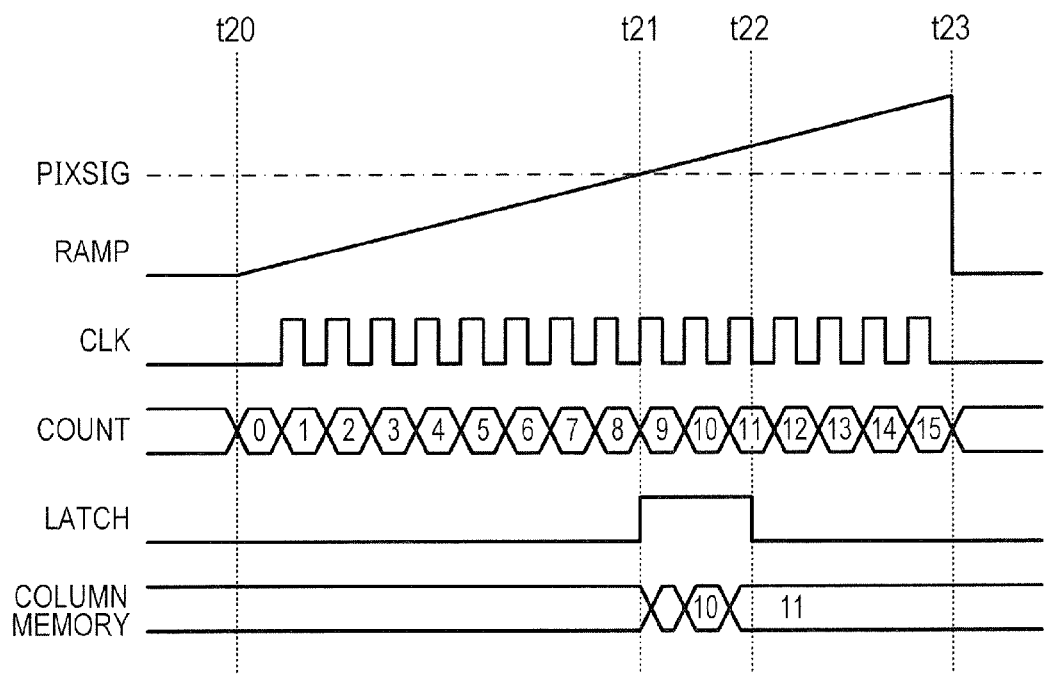
FIG. 2 is a view illustrating an operation timing of an analog-to-digital conversion circuit.

FIG. 1 is a view illustrating a configuration example of an imaging apparatus 100 according to a first embodiment of the present invention; and FIG. 2 is a timing chart illustrating a method for driving the imaging apparatus 100. The imaging apparatus 100 has an analog-to-digital conversion circuit 300, photoelectrically converts incident light, and outputs the obtained electric signal to the outside, as a digital signal. The imaging apparatus 100 has a pixel array 110, a vertical scanning circuit 120, a horizontal scanning circuit 130, comparators 140, a counter 160, a ramp signal generating circuit 170, a column memory group 181, a timing control unit 190, and a signal processing unit 191. In addition, the imaging apparatus 100 has row control lines 112, vertical signal lines 113, count signal wiring 182, vertical count wiring 183, and horizontal count wiring 184. The column memory group 181 has a plurality of column memories 180. The plurality of column memories 180 are provided so as to correspond to the plurality of comparators 140, respectively. The pixel array 110 has a plurality of pixels 111 each of which contains a photoelectric conversion element. The plurality of pixels 111 are arranged in a two-dimensional matrix form, in the pixel array 110. In FIG. 1, the pixels 111 of two rows are illustrated, but the number of the rows of the pixels 111 is not limited to two.

The vertical scanning circuit 120 is electrically connected to the plurality of pixels 111 through the plurality of row control lines 112, on a row by row basis. One row control line 112 is provided in common to the pixels 111 in one corresponding row. The vertical scanning circuit 120 is electrically connected to the timing control unit 190. The vertical scanning circuit 120 sets signal levels to be supplied to the plurality of row control lines 112 at high levels, respectively, based on signals which are supplied from the timing control unit 190. When the signal level of the row control line 112 which is electrically connected to the pixels 111 becomes a high level, each pixel 111 in the row corresponding to the row control line 112 outputs a signal PIXSIG based on the incident light, to the vertical signal line 113 in each column. The plurality of vertical signal lines 113 are connected in common to the pixels 111 in the respective columns.

The ramp signal generating circuit 170 generates a ramp signal RAMP. The ramp signal RAMP is a reference signal of which the signal level changes with elapse of time (monotonically increases or monotonically decreases). The ramp signal generating circuit 170 supplies the ramp signal RAMP to each of the plurality of comparators 140, through the ramp signal line 171. The ramp signal generating circuit 170 is electrically connected to the timing control unit 190. The ramp signal generating circuit 170 starts the change of the signal level with elapse of time of the ramp signal RAMP, based on the signal which is supplied from the timing control unit 190.

Each of the plurality of comparators 140 is provided so as to correspond to each of the plurality of vertical signal lines 113 of the pixel array 110. Specifically, one comparator 140 is provided so as to correspond to one column of the pixels 111. Each of the plurality of comparators 140 is electrically connected to the ramp signal generating circuit 170 and one of the vertical signal lines 113. In addition, each of the plurality of comparators 140 is electrically connected to each of the plurality of correspondingly provided column memories 180. Each of the plurality of comparators 140 supplies a signal LATCH to each of the plurality of column memories 180. Each of the plurality of comparators 140 outputs a comparing result signal LATCH indicating a result of comparing a plurality of analog signals PIXSIG sent from the pixels 111 of the plurality of columns and the ramp signals RAMP, respectively. The comparator 140 sets the signal LATCH from a low level to a high level, at the time t21 (FIG. 2) when the signal level of the ramp signal RAMP becomes larger than the signal level of the signal PIXSIG. At the time t22 (FIG. 2) after a predetermined period of the above setting, the comparator 140 sets the signal LATCH from the high level to the low level. In other words, the signal LATCH is a signal of which the signal level changes according to the change of a result of the comparison that is performed by the comparator 140.

The counter 160 counts a clock signal CLK which is output from the timing control unit 190 to the counter 160. Due to this count operation, the counter 160 generates a signal COUNT which is a count signal. The counter 160 supplies the signal COUNT to each of the plurality of column memories 180 through the count signal wiring 182, the vertical count wiring 183 and the horizontal count wiring 184. The counter 160 counts a signal CLK which is supplied from the timing control unit 190 to the counter 160, and outputs the count value as the signal COUNT. The signal CLK is the clock signal. In addition, the signal COUNT is a Gray code of which the Hamming distance between the count values adjacent backward and forward is 1.

The count signal wiring 182 is electrically connected between the counter 160 and the vertical count wiring 183. The vertical count wiring 183 is electrically connected between the count signal wiring 182 and the horizontal count wiring 184. The horizontal count wiring 184 is electrically connected to the column memory 180 in the column memory group 181. The number of the column memory groups 181 becomes a value obtained by dividing the column memories 180 in all the columns by a block division number N (N≥1 and integer). In addition, the count signal wiring 182, the vertical count wiring 183 and the horizontal count wiring 184 are each bus wiring of a plurality of bits corresponding to the resolution of the counter 160.

The analog-to-digital conversion circuit 300 has the plurality of comparators 140, the ramp signal generating circuit 170, the counter 160 and the plurality of column memory groups 181, and converts the signal PIXSIG from the analog signal to the digital signal. The plurality of pixels 111 outputs the plurality of analog signals PIXSIG based on the photoelectric conversion, to the analog-to-digital conversion circuit 300.

Next, an operation of the imaging apparatus 100 in FIG. 1 will be described below with reference to FIG. 2. Each signal of FIG. 2 corresponds to each signal illustrated in FIG. 1. FIG. 2 is a timing chart illustrating the operation in the case where the imaging apparatus 100 generates a digital signal based on incident light, as a normal operation. Incidentally, the signal COUNT is a digital signal of 5 bits. The "column memory" represents a digital signal which is held by the column memory 180. For the simplicity of description, each of the signal COUNT and the signal which is held by the column memory 180 is expressed by the decimal number. Each of the signals expressed by the decimal number is actually a signal which is expressed by the Gray code of the binary number of 5 bits.

At the time t20, the pixel 111 which is electrically connected to the row signal line 112 of a high level outputs the signal PIXSIG based on the incident light, to the vertical signal line 113. At the time t20, the ramp signal generating circuit 150 starts changing the signal level of the ramp signal RAMP with elapse of time, by the control of the timing control unit 190. In addition, at the time t20, the counter 160 starts counting the pulse of the signal CLK which is supplied from the timing control unit 190.

At the time t21, the magnitude relation between the signal level of the signal PIXSIG which the pixel 111 outputs to the vertical signal line 113 and the ramp signal RAMP is reversed, and accordingly the comparator 140 sets the signal level of the signal LATCH from the low level to the high level. At the time t22 after elapse of predetermined time from the time t21, the comparator 140 sets the signal level of the signal LATCH from the high level to the low level. The column memory 180 holds the signal COUNT of the time t22 when the signal level of the signal LATCH has changed to the low level from the high level. Each of the plurality of column memories 180 is a memory which holds the digital signal based on the analog signal of the signal PIXSIG. The value held by the column memory 180 is a value of the count signal that is based on a period between the time t20 at which the ramp signal RAMP that is the reference signal starts changing the signal level and the time t22 at which the signal level of the comparing result signal LATCH of the comparator 140 changes to the low level.

The plurality of column memories 180 stores the count signal COUNT which is based on a period between the time t20 at which the ramp signal RAMP starts changing the signal level and the time t21 or t22 at which the signal level of the comparing result signal LATCH of the plurality of comparators 140 changes, respectively.

At the time t23, the ramp signal generating circuit 170 ends the change of the signal level of the ramp signal RAMP with elapse of time. After that, the horizontal scanning circuit 130 sequentially scans the plurality of column memories 180, and sequentially outputs the signals which have been held by each of the plurality of column memories 180, to the signal processing unit 191.

Figure 3A:
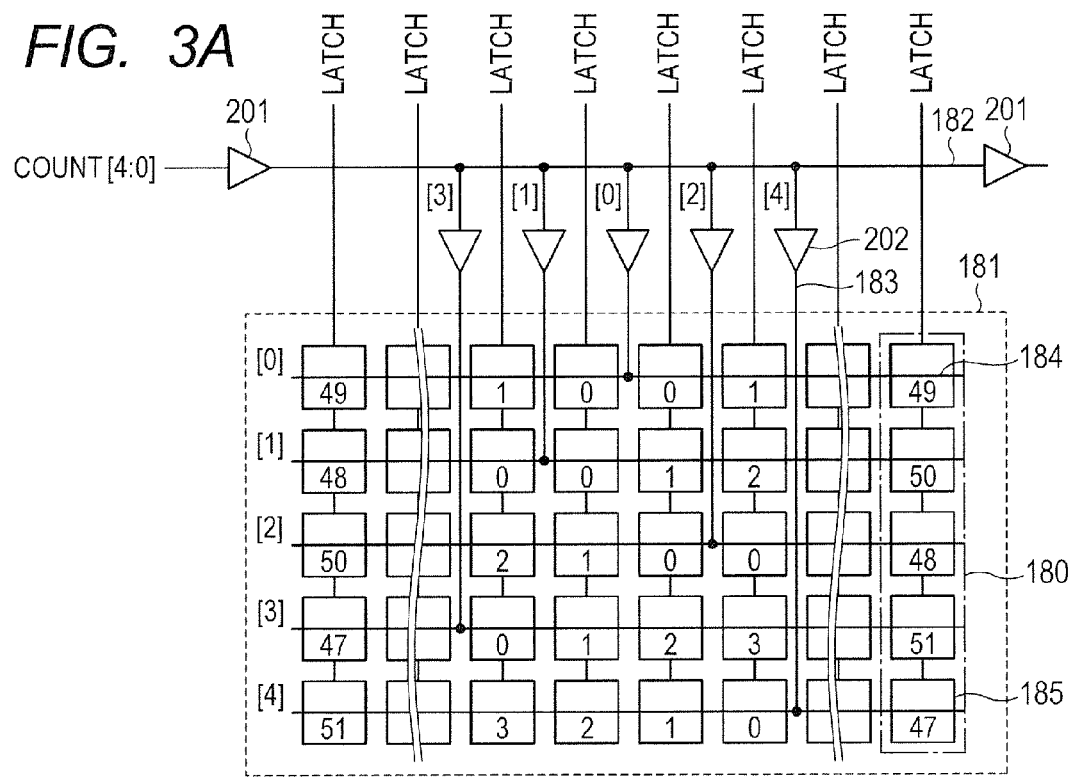
FIGS. 3A and 3B are views illustrating one example of configurations of column memory groups.

FIG. 3A is a view illustrating one example of a configuration of the column memory group 181. A count signal COUNT[4:0] will be described below as digital signals COUNT[0] to COUNT[4] of 5 bits each, but the numbers are not limited to the above numbers. The column memory group 181 has, for instance, the column memories 180 of 100 columns. In addition, each of the plurality of column memories 180 is a memory group, and has five bit memories 185 which store the five bit values COUNT[0] to COUNT[4] of the signal COUNT[4:0], respectively. The bit memory 185 is a memory of one bit. The five bit memories 185 in the column memory 180 are connected by the horizontal count wiring 184 which is wired in a horizontal direction, so as to hold each of the signals COUNT[0] to COUNT[4] of five bits according to the signal LATCH, which correspond to each bit signal sequentially from the top of the drawing. The plurality of horizontal count wirings 184 are a plurality of second signal wirings. The plurality of horizontal count wirings 184 connect the bit memories 185 having the same bit number as that in the plurality of bit values COUNT[0] to COUNT[4] of the signal COUNT[4:0], out of the plurality of bit memories 185 in the plurality of column memories 180, to each other. Specifically, each of the plurality of horizontal count wirings 184 connects between the bit memories 185 of the plurality of column memories 180. The plurality of horizontal count wirings 184 is connected to the plurality of vertical count wirings 183 having the same bit number as that in the plurality of bit values COUNT[0] to COUNT[4] of the signal COUNT[4:0], respectively.

The signal COUNT[4:0] is supplied to each of the bit memories 185 through a count signal repeat buffer 201, the count signal wiring 182, a count signal buffer 202, the vertical count wiring 183 and the horizontal count wiring 184. The count signal wirings 182 are third signal wiring, and supply the plurality of bit values (five bit values) of the signal COUNT[4:0] to the plurality of vertical count wirings 183, respectively. Each of the plurality of vertical count wirings 183 is each of the plurality of first signal wirings. Each of the plurality of vertical count wirings 183 transmits a bit value of each of the plurality of bit values COUNT[0] to COUNT[4] of the signal COUNT[4:0]. The count signal repeat buffer 201 is a second buffer, and is connected so as to divide the count signal wiring 182 into a plurality of count signal wirings. The count signal buffer 202 is connected between the count signal wiring 182 and the vertical count wiring 183 which is wired in a vertical direction. The horizontal count wiring 184 which is wired in a horizontal direction is connected between the vertical count wiring 183 and each of the bit memories 185. The count signal buffers 202 are a plurality of first buffers, and are connected to the plurality of vertical count wirings 183, respectively.

A vertical count wiring 183 to which a signal COUNT[0] that is the least significant bit in the signal COUNT[4:0] is connected is arranged so as to be sandwiched between the vertical count wirings 183 to which the signals COUNT[1] to [4] having other bits than the least significant bit of the signal COUNT[0] are connected. Specifically, the vertical count wiring 183 of the signal COUNT[0] of the least significant bit is arranged in the center, and the vertical count wirings 183 of the signals COUNT[1] to [4] which have a plurality of the other bits than the least significant bit, respectively, are arranged so as to be distributed in right and left positions (toward both of outside directions) alternately in an ascending order of the bit number.

The vertical count wiring 183 of the signal COUNT[0] of the least significant bit is arranged in the center, and is connected to bit memories 185 of the uppermost row through a horizontal count wiring 184. A vertical count wiring 183 of the signal COUNT[1] of the second low-order bit from the least significant bit is arranged on the left of the vertical count wiring 183 of the signal COUNT[0], and is connected to bit memories 185 of the second row from the top through a horizontal count wiring 184. A vertical count wiring 183 of the signal COUNT[2] of the third low-order bit from the least significant bit is arranged on the right of the vertical count wiring 183 of the signal COUNT[0], and is connected to bit memories 185 of the third row from the top through a horizontal count wiring 184. A vertical count wiring 183 of the signal COUNT[3] of the fourth low-order bit from the least significant bit is arranged on the left of the vertical count wiring 183 of the signal COUNT[1], and is connected to bit memories 185 of the fourth row from the top through a horizontal count wiring 184. A vertical count wiring 183 of the signal COUNT[4] of the fifth low-order bit from the least significant bit is arranged on the right of the vertical count wiring 183 of the signal COUNT[2], and is connected to bit memories 185 of the fifth row from the top through a horizontal count wiring 184.

In the present embodiment, the count signal repeat buffer 201 and the column memory input buffer 202 are not indispensable. In the case where the loads on the count signal wiring 182 and the vertical count wiring 183 are large, if any one of the count signal repeat buffer 201 and the column memory input buffer 202 is arranged, transmission characteristics of the signal COUNT[4:0] can be enhanced.

Numerals described in the bit memories 185 mean a relative difference in delay time, which depends on a wiring length of the horizontal count wiring 184 among each of the columns. The prerequisite for the difference in the delay time will be described below. In the present embodiment, in order to simplify the description, the delay time of the signal due to the count signal wiring 182 and the vertical count wiring 183 shall be neglected, and the prerequisite shall be considered. Then, suppose that a difference in a wiring length among the bit memories 185 which are connected to the horizontal count wiring 184 causes the signal delay. The difference in the delay time between the adjacent bit memories 185 shall be determined as 1. In FIG. 3A, bit memories 185 adjacent to the point to which the vertical count wiring 183 and the horizontal count wiring 184 are connected are determined to be a reference, and the number of the bit memories 185 from the reference in the horizontal direction is counted and is shown by a numeral as the difference in the delay time in the bit memory 185. Then, the amount of the delay time of the count signals becomes large in the bit memories 185 in the column memory groups 181 on the left end and the right end.

Figure 3B:
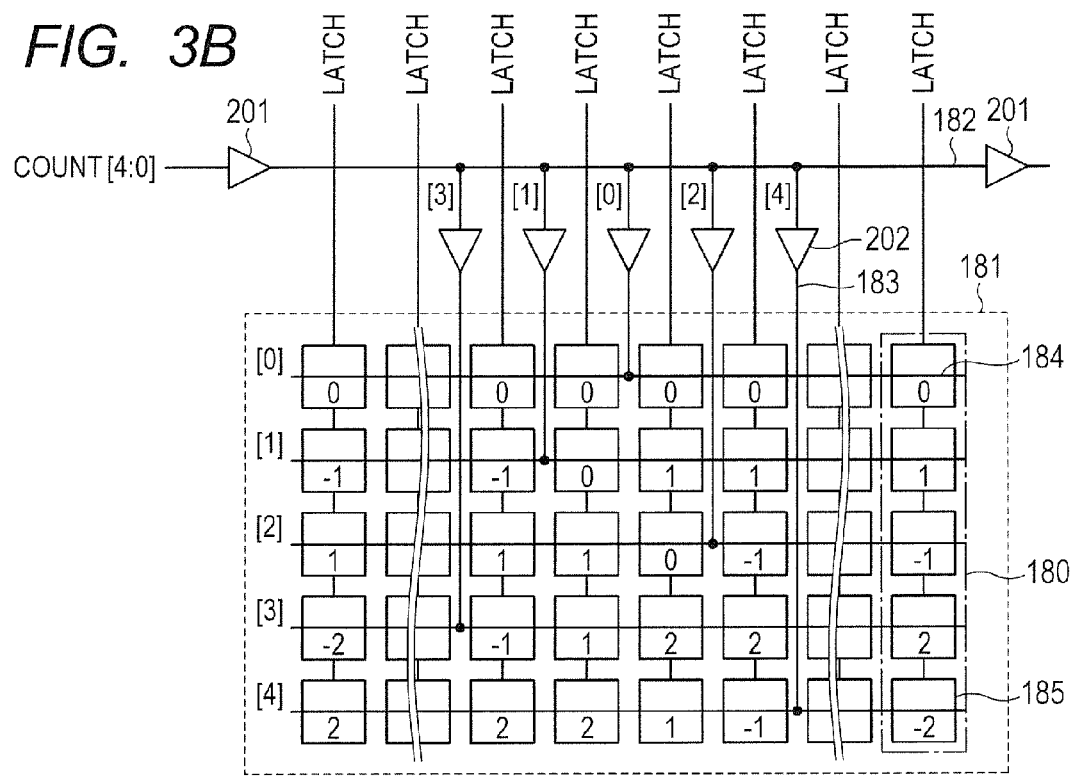

FIG. 3B illustrates the difference in the delay time among each of the bit signals in each of the column memories 180 in FIG. 3A by a numeral, while regarding the signal COUNT [0] as a reference. In the present embodiment, it is understood that the difference in the delay time among the bit signals in each of the columns is as small as within ±2.

Figure 4A:
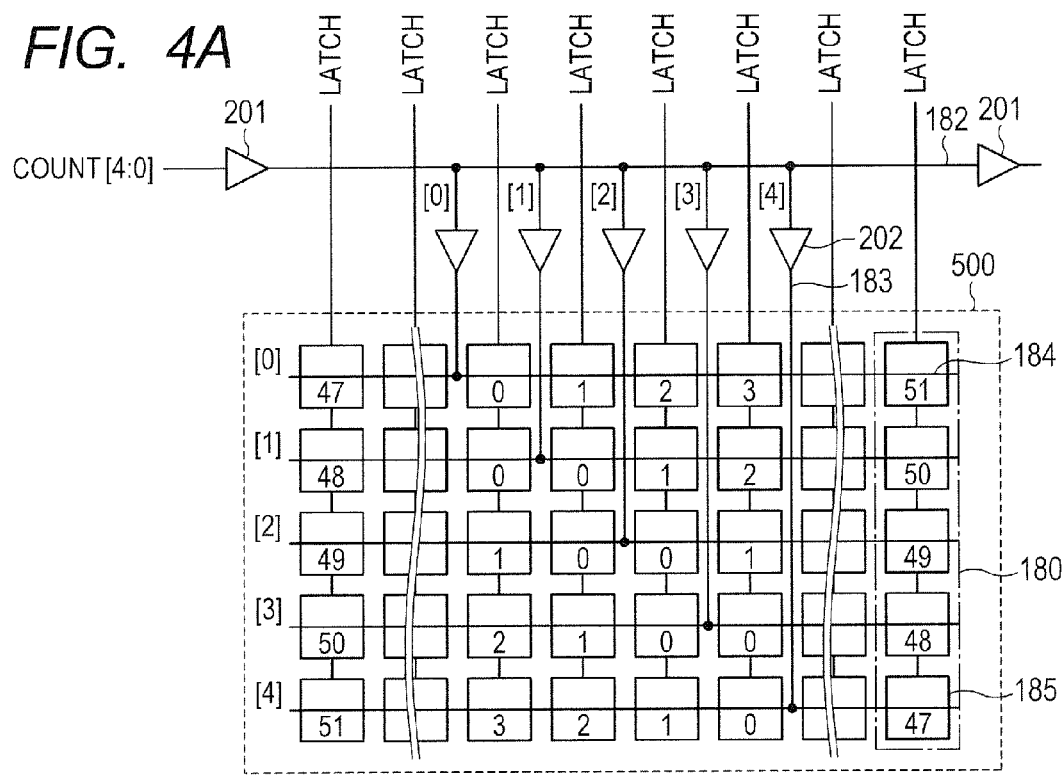
FIGS. 4A and 4B are views illustrating the column memory group.
Figure 4B:
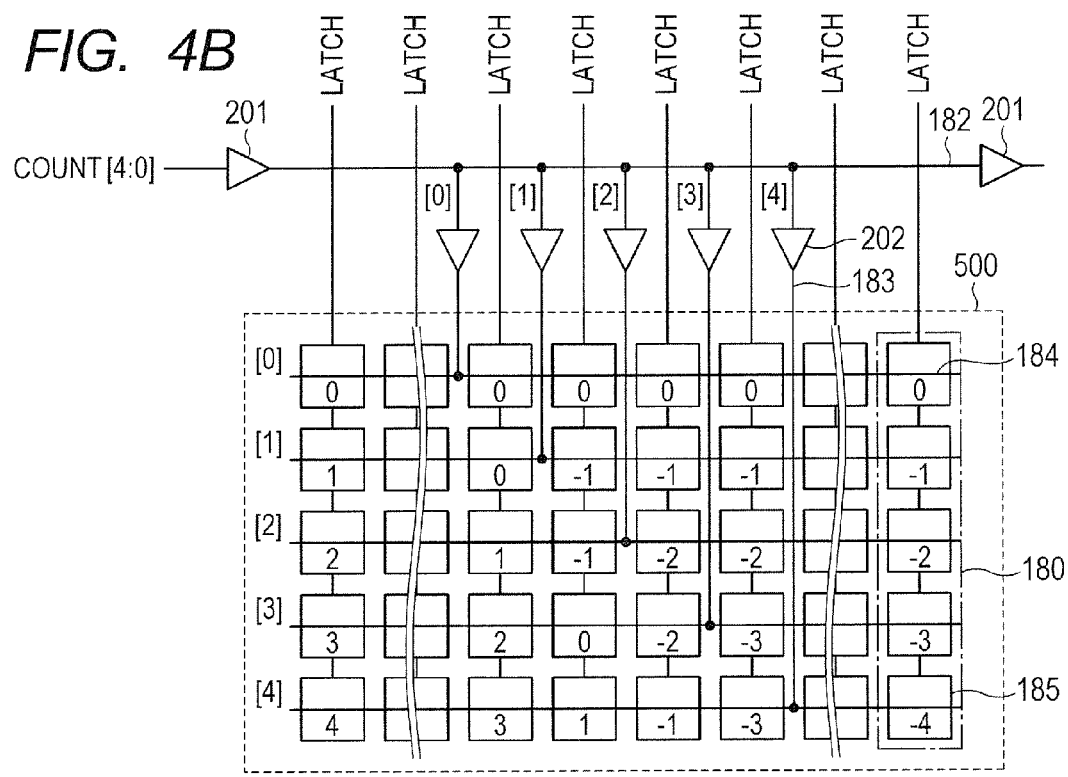

FIGS. 4A and 4B are views illustrating a method of connecting count signal wiring to memories according to a comparative example. In FIGS. 4A and 4B, the vertical count wirings 183 and the horizontal count wirings 184 are each arranged sequentially from the signal COUNT[0] to the signal COUNT[4], and are connected to each other. The amount of the delay time of the count signal between the referential bit memory and each of other bit memories 185 at this time has been calculated, similarly to that in FIGS. 3A and 3B. FIG. 4A illustrates the amount of the delay time, and FIG. 4B illustrates the difference in the delay time between the bits in each of the columns. In FIG. 4B, the difference in the delay time among the bit signals in each of the columns is as large as ±4.

It can be said that the fact that the small difference in the delay time of the present embodiment in FIG. 3B means that the present embodiment can reduce a derivative-non-linearity error (DNL) of digital data or is suitable for the speed enhancement of the count signal.

Figure 5:
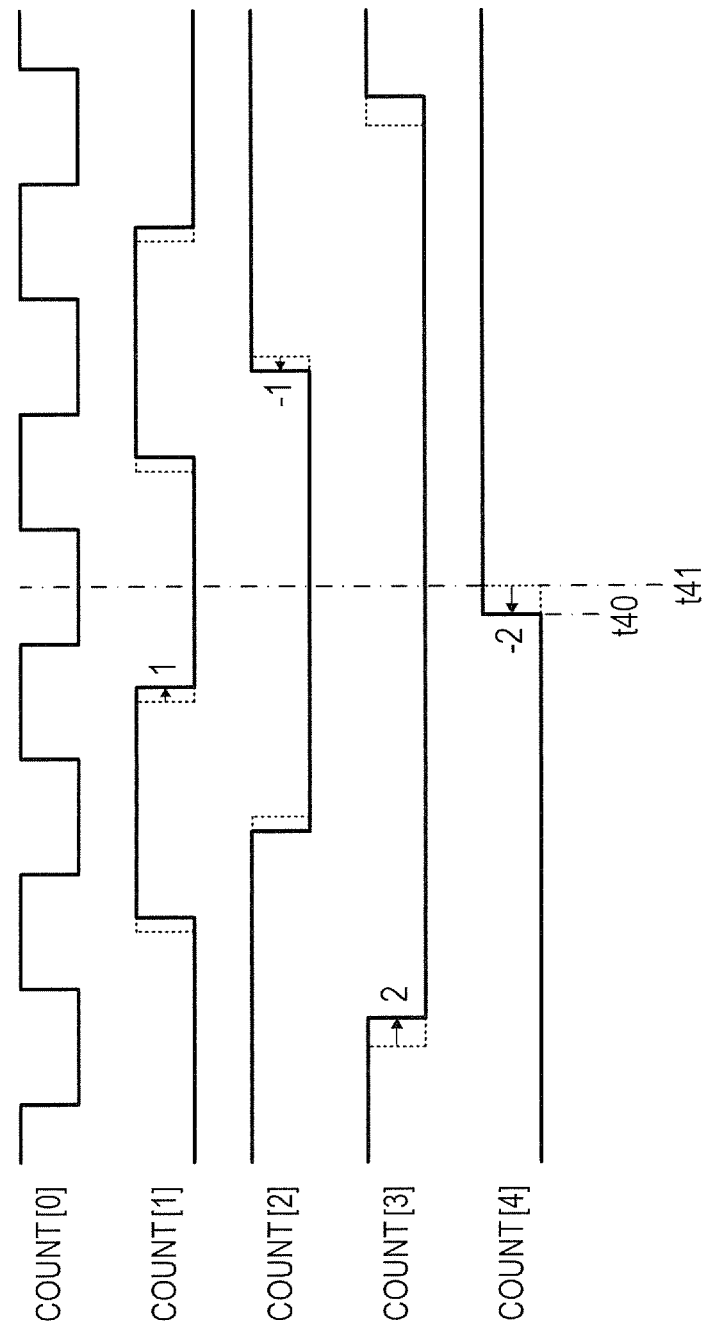
FIG. 5 is a view illustrating timings of count signals.

FIG. 5 is a timing chart of the count signals COUNT[0] to COUNT[4] of the column memory 180 of the rightmost end of the column memory group 181, which is shown by being surrounded by a dashed dotted line, in FIG. 3B. The signals COUNT[1] to COUNT[4] are shown by a dashed line in the ideal case where the delay time does not occur, and are shown by a solid line in the case where the difference in the delay time is reflected. The numeral which is attached to the solid line is the difference in the delay time described in the bit memory 185 in FIG. 3B. The positive and negative reference character "−" of the difference in the delay time shows that the phase of the count signal progresses compared to the ideal case where the delay time does not occur. As for the ideal timing of the signal COUNT[4], the signal should change at the time t41. However, in the present embodiment, the difference in the delay time is −2, which means that the phase progresses, and the signal changes at the time t40.

The signals COUNT[1] to COUNT[4] are Gray codes, and accordingly the count value is determined by a phase difference between the signal COUNT[0] and each of the signals COUNT[1] to COUNT[4]. For this reason, if the difference in the delay time between the signal COUNT[0] and the signal COUNT[4] is within 1 LSB, the difference does not affect the count value. If the difference in the delay time is small, the count value does not change, and such an analog-to-digital conversion circuit results in being capable of coping with the speed enhancement. Accordingly, when the connection method of the present embodiment is employed, the derivative-non-linearity error (DNL) is improved, and the speed can be enhanced.

In the present embodiment, the vertical count wiring 183 of the signal COUNT[0] of the least significant bit is arranged in the center, and the vertical count wirings 183 of the signals COUNT[1] to COUNT[4] which have the other bits, respectively, are arranged so as to be distributed in right and left positions alternately in an ascending order of the bit number. This is because the smaller is the bit number, the more is the changing point of the signal level, and an effect of reducing the aggravation of linearity is large. The wirings may be connected so that the aggravation of the linearity is improved by at least other one bit than the least significant bit.

Incidentally, the imaging apparatus 100 of the present embodiment may further have an amplifying unit which amplifies the signal PIXSIG that has been output to the vertical signal line 113 and outputs the resultant signal to the comparator 140. In addition, in the present embodiment, the ramp signal RAMP is a signal of which the signal level changes in a slope shape with elapse of timed. The ramp signal RAMP may be a signal of which the signal level changes in a staircase pattern with elapse of time. Such a ramp signal RAMP of which the signal level changes in the staircase pattern is also a reference signal of which the signal level changes with elapse of time.

Second Embodiment

Figure 6:
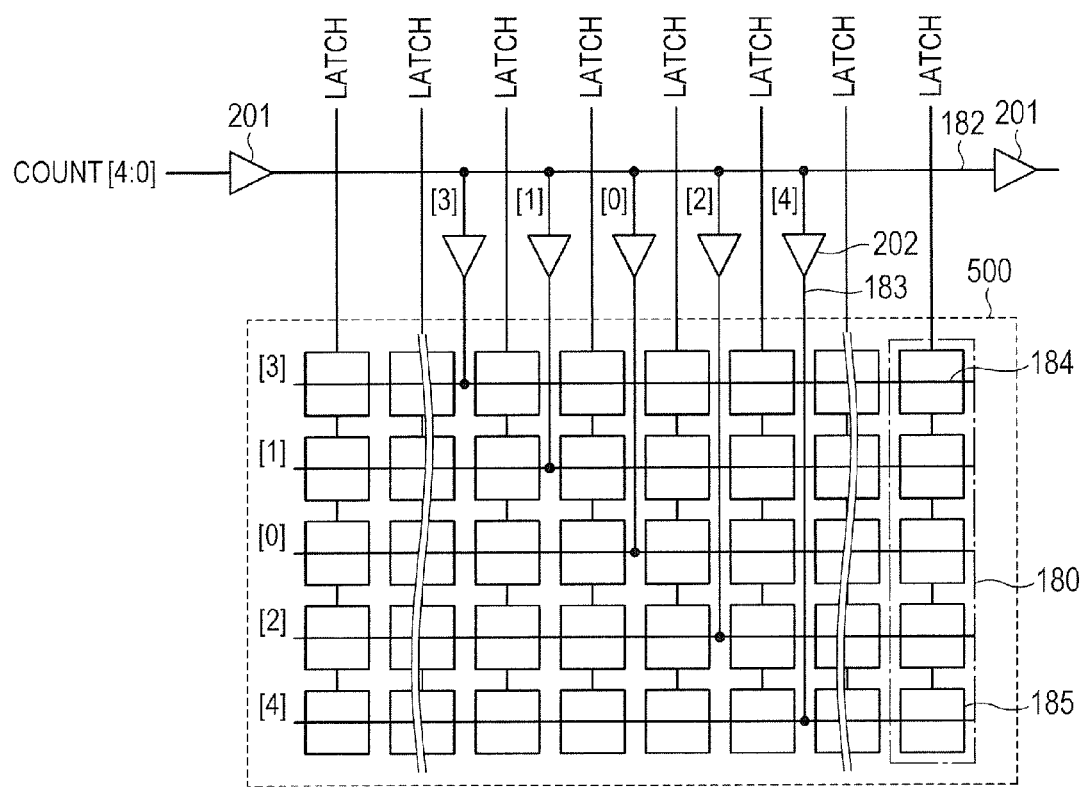
FIG. 6 is a view illustrating a configuration example of the imaging apparatus.

The imaging apparatus 100 according to a second embodiment of the present invention has a column memory group 500 in FIG. 6 provided in place of the column memory group 181 in FIGS. 3A and 3B. In other words, in the imaging apparatus 100 in FIG. 1, the column memory group 500 in FIG. 6 is provided in place of the column memory group 181. The imaging apparatus 100 of the present embodiment has the column memory group 500. The points will be described below in which the present embodiment (FIG. 6) is different from the first embodiment (FIGS. 3A and 3B).

FIG. 6 is a view illustrating a configuration example of the column memory group 500. The column memory group 500 has a plurality of column memories 180 and horizontal count wirings 184. The column memory 180 has a plurality of bit memories 185 corresponding to the number of bits of the count signal. The bit memory 185 is a memory of one bit. Each of the plurality of horizontal count wirings 184 is electrically connected to each bit of the bit memories 185 in the plurality of columns.

The points in which the present embodiment is different from the first embodiment will be described below. In the present embodiment, the horizontal count wiring 184 of the signal COUNT[0] of the least significant bit is arranged in the center, and the horizontal count wirings 184 of the signals COUNT[1] to COUNT[4] which have a plurality of the other bits than the least significant bit, respectively, are arranged alternately above and below (toward both of outside directions) in an ascending order of the bit number.

The horizontal count wiring 184 of the signal COUNT[0] of the least significant bit is arranged in the center, and is connected to the bit memories 185 of the third row from the top. A horizontal count wiring 184 of the signal COUNT[1] of the second low-order bit from the least significant bit is arranged above the horizontal count wiring 184 of the signal COUNT[0], and is connected to bit memories 185 of the second row from the top. A horizontal count wiring 184 of the signal COUNT[2] of the third low-order bit from the least significant bit is arranged under the horizontal count wiring 184 of the signal COUNT[0], and is connected to bit memories 185 of the fourth row from the top. A horizontal count wiring 184 of the signal COUNT[3] of the fourth low-order bit from the least significant bit is arranged on the left of the horizontal count wiring 184 of the signal COUNT[1], and is connected to bit memories 185 of the first row from the top. A horizontal count wiring 184 of the signal COUNT[4] of the fifth low-order bit from the least significant bit is arranged under the horizontal count wiring 184 of the signal COUNT[2], and is connected to bit memories 185 of the fifth row from the top.

The first embodiment has been described on the assumption that the difference in the delay time does not occur due to the vertical count wiring 183, for the simplification of the description. However, when the connection in the present embodiment is employed, the difference in the delay time due to the vertical count wiring 183 can be improved.

In the present embodiment, the horizontal count wiring 184 of the signal COUNT[0] of the least significant bit is arranged in the center, and the horizontal count wirings 184 of the signals COUNT[1] to COUNT[4] which have the other bits, respectively, are arranged alternately above and below in an ascending order of the bit number. This is because the smaller is the bit number, the more is the changing point of the signal level, and an effect of improving the linearity is large. The wirings may be connected so that the linearity is improved by at least other one bit than the least significant bit.

As has been described above, either or both of the vertical count wiring 183 and the horizontal count wiring 184 are arranged so that either or both of the signal wirings of the COUNT[0] of the least significant bit of the digital signal COUNT[4:0] are arranged between the signal wirings of the COUNT[1] to COUNT[4] which have the plurality of the other bits, respectively.

Third Embodiment

Figure 7:
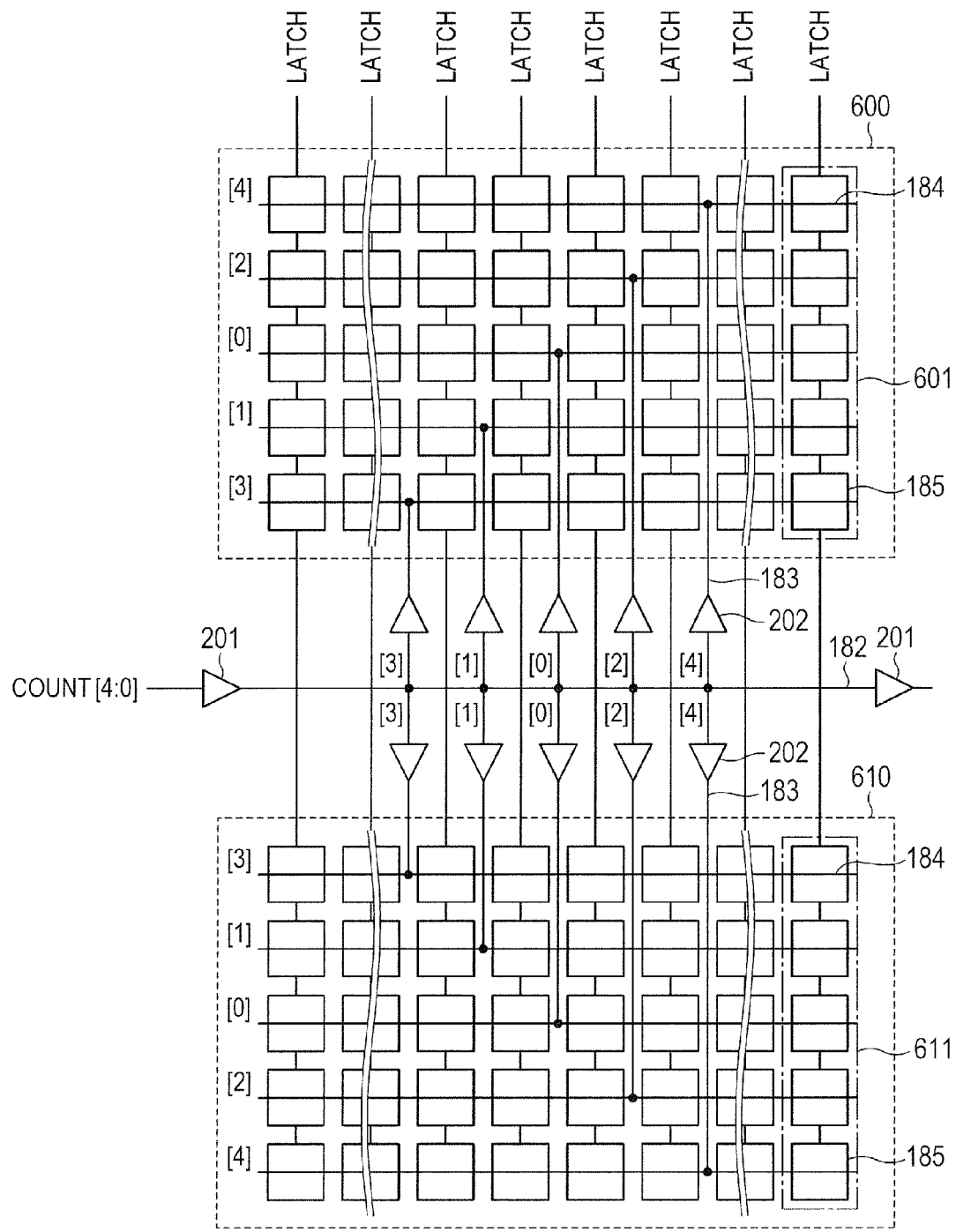
FIG. 7 is a view illustrating a configuration example of the imaging apparatus.

The imaging apparatus 100 according to a third embodiment of the present invention has a column N memory group 600 and a column S memory group 610 in FIG. 7 provided in place of the column memory group 500 in FIG. 6. In other words, in the imaging apparatus 100 in FIG. 1, the column N memory group 600 and the column S memory group 610 in FIG. 7 are provided in place of the column memory group 181. The imaging apparatus 100 of the present embodiment has the column N memory group 600 and the column S memory group 610. The points will be described below in which the present embodiment is different from the second embodiment.

The imaging apparatus 100 converts the signal PIXSIG at the time when the pixel 111 has been reset, from the analog signal to the digital signal (N conversion), and holds the count value in the column N memory group 600. After that, the imaging apparatus 100 converts the signal PIXSIG at the time when the pixel 111 is not reset, from the analog signal to the digital signal (S conversion), and holds the count value in the column S memory group 610. The signal processing unit 191 performs digital CDS (Correlated Double Sampling) processing which determines a difference between a count value of the column N memory group 600 and a count value of the column S memory group 610, and extracts the signal component of the pixel 111. The reset of the pixel 111, which has been described here, will be described below. The pixel 111 has a photoelectric conversion unit which photoelectrically converts the incident light and thereby generates an electric charge, a charge holding unit which accumulates the electric charge generated by the photoelectric conversion unit therein, and an output unit which outputs the signal based on the potential of the above described charge holding unit as the signal PIXSIG. The reset of the pixel 111 means an operation that the output unit outputs the reset signal by the operation of resetting the potential of this charge accumulation unit (output unit). In addition, the signal PIXSIG at the time when the pixel 111 is not reset means a photoelectric conversion signal output by the output unit, based on the potential of the charge accumulation unit which has accumulated the electric charge generated by the photoelectric conversion unit therein.

FIG. 7 is a view illustrating a configuration example of the column N memory group 600 and the column S memory group 610. A point in which the present embodiment (FIG. 7) is different from the second embodiment (FIG. 6) is the point that the column N memory group 600 and the column S memory group 610 are arranged in place of the column memory group 500.

The column N memory group 600 has a plurality of column N memories 601 and horizontal count wirings 184. The column N memory 601 has a plurality of first bit memories 185 corresponding to the number of bits of the N conversion, and stores the digital signal COUNT[4:0] corresponding to the analog signal PIXSIG at the time when the pixel 111 is reset.

The column S memory group 610 has a plurality of column S memories 611 and horizontal count wirings 184. The column S memory 611 has a plurality of second bit memories 185 corresponding to the number of bits of the S conversion, and stores the digital signal COUNT[4:0] corresponding to the analog signal PIXSIG at the time when the pixel 111 is not reset. In the column N memory group 600 and the column S memory group 610, the wiring lengths of the vertical count wirings 183 from the counter 160 to the bit memories 185 are equal which hold the signal COUNT[0] of the least significant bit. In the present embodiment, the number of the bits is equalized between the column N memory 601 and the column S memory 611, but is not limited to the equal number.

In the present embodiment, not only a relative error between each of the bits but also a relative error between the column N memory group 600 and the column S memory group 610 must be considered. Specifically, as is illustrated in FIG. 7, when the column N memory group 600 and the column S memory group 610 are arranged above and below, it is desirable that the column N memory group 600 and the column S memory group 610 are arranged so as to be axisymmetric between the upper side and the lower side. Each of the column N memory group 600 and the column S memory group 610 has a similar configuration to that of the column memory group 500 in FIG. 6.

Fourth Embodiment

Figure 8:
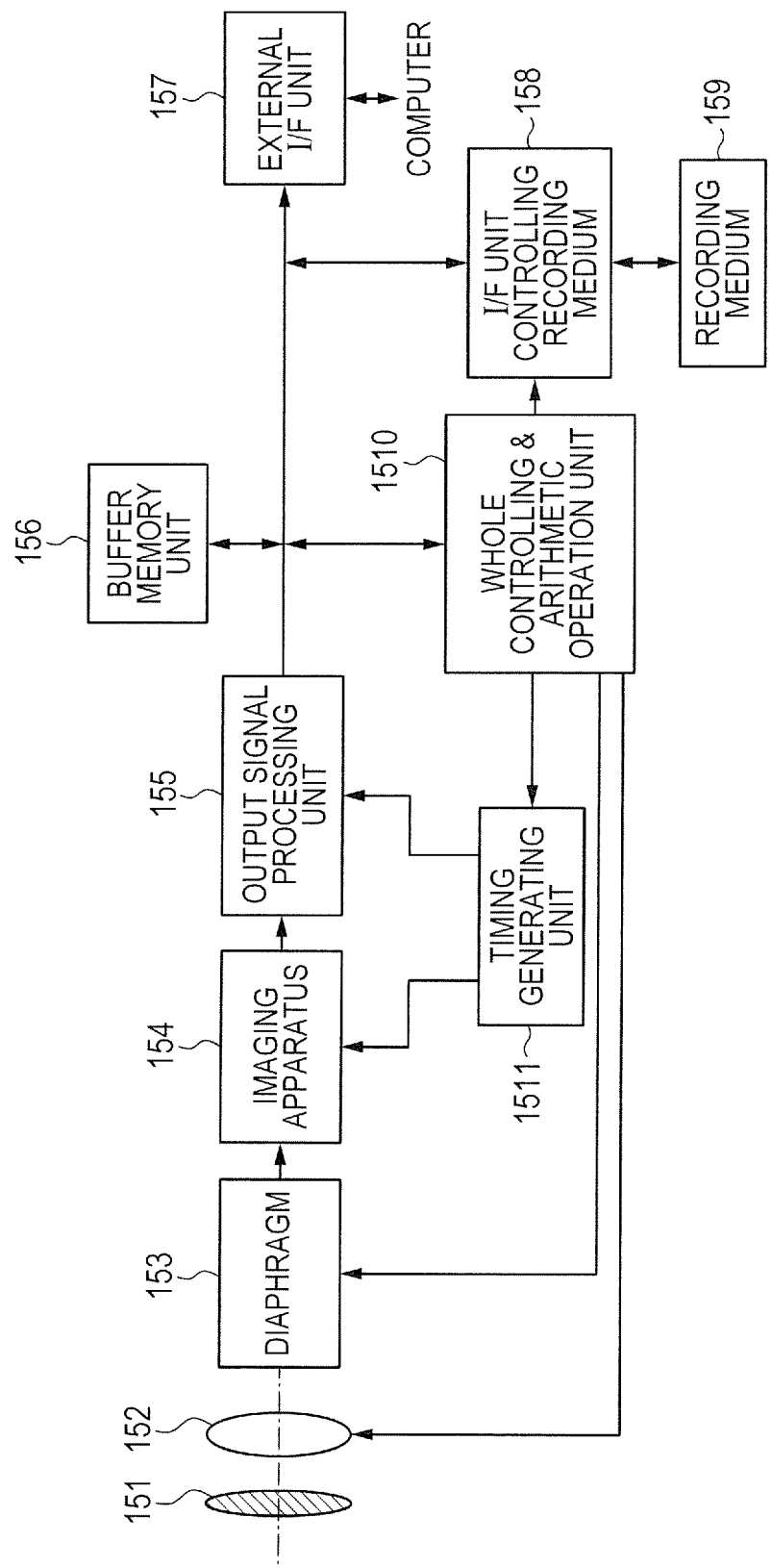
FIG. 8 is a view illustrating a configuration example of an imaging system.

The imaging apparatus 100 which has been described in the above described first to third embodiments can be applied to various imaging systems. The imaging systems include a digital still camera, a digital camcorder and a monitoring camera, as one example. FIG. 8 illustrates a view of an imaging system in which any one of the imaging apparatuses 100 of the first to third embodiments is applied to the digital still camera, as one example of the imaging system.

The imaging system exemplified in FIG. 8 has an imaging apparatus 154, a barrier 151 for protecting a lens 152, the lens 152 which images an optical image of an object on the imaging apparatus 154, and a diaphragm 153 for varying the quantity of light which passes through the lens 152. The lens 152 and the diaphragm 153 form an optical system which condenses light to the imaging apparatus 154. The imaging apparatus 154 is any one of the imaging apparatuses 100 of the first to third embodiments. In addition, the imaging system exemplified in FIG. 8 has an output signal processing unit 155 for processing an output signal which is output from the imaging apparatus 154.

The output signal processing unit 155 generates an image based on the signal which the imaging apparatus 154 outputs. Specifically, the output signal processing unit 155 performs various types of corrections and compressions, as needed, and outputs the image data. The imaging system exemplified in FIG. 8 further has a buffer memory unit 156 for temporarily storing the image data therein, and an external interface unit (external I/F unit) 157 for communicating with an external computer and the like. The imaging system further has a recording medium 159 for performing recording or readout of the imaged data, such as a semiconductor memory, and an interface unit controlling recording medium (I/F unit controlling recording medium) 158 for recording or reading out the data in or from the recording medium 159. Incidentally, the recording medium 159 may be built in the imaging system, or may also be removable.

The imaging system further has a whole controlling & arithmetic operation unit 1510 which performs various arithmetic operations and controls the whole digital still camera, and a timing generating unit 1511 which outputs various timing signals to the imaging apparatus 154 and the output signal processing unit 155. Here, the timing signal and the like may be input from the outside; and the imaging system may have at least the imaging apparatus 154, and the output signal processing unit 155 which processes the output signal output from the imaging apparatus 154. As in the above description, the imaging system of the present embodiment can perform an imaging operation by having the imaging apparatus 154 applied thereto.

The present invention can reduce a difference in delay time between bits of digital signals which are input to memories, improve the linearity of analog-to-digital conversion, and can enhance the speed of the analog-to-digital conversion.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-218589, filed Oct. 27, 2014, which is hereby incorporated by reference herein in its entirety.

What is claimed is:
1. An analog-to-digital conversion circuit comprising:
a plurality of comparators, each configured to output a comparing result signal indicating a result of comparing an analog signal with a reference signal having a signal level changing with elapse of time;
a plurality of memories, each arranged correspondingly to one of the plurality of comparators;
a counter configured to generate a count signal having a plurality of bits in Gray code by counting a clock signal; and
a plurality of first signal wirings, each configured to transmit one of the plurality of bits of the count signal from the counter to the plurality of memories, wherein
each of the plurality of memories holds the count signal according to a signal level change of the comparing result signal of corresponding one of the plurality of comparators, to convert the analog signal to a digital signal, and wherein
each of the plurality of memories has a plurality of bit memories, each storing one bit of the plurality of bits, the analog-to-digital conversion circuit further comprises a plurality of second signal wirings, each connecting between the bit memories of the plurality of memories, each of the plurality of second signal wirings is connected to one of the plurality of first signal wirings, and
the plurality of first signal wirings and/or the plurality of second signal wirings include a signal wiring transmitting a signal of least significant bit in the count signal arranged between the other signal wirings each transmitting a signal of a bit different from the least significant bit in the count signal.

2. The analog-to-digital conversion circuit according to claim 1, wherein
the signal wiring transmitting the signal of the least significant bit included in the plurality of first signal wirings is arranged in a center, and the other signal wirings included in the plurality of first signal wirings are arranged in ascending order of a bit number successively from both sides of the signal wiring transmitting the signal of the least significant bit, alternately toward both of outside directions.

3. The analog-to-digital conversion circuit according to claim 1, wherein
the signal wiring transmitting the signal of the least significant bit included in the plurality of second signal wirings is arranged in a center, and the other signal wirings included in the plurality of second signal wirings are arranged in ascending order of a bit number successively from both sides of the signal of the least significant bit, alternately toward both of outside directions.

4. The analog-to-digital conversion circuit according to claim 1, further comprising
a plurality of first buffers each connected to one of the plurality of first signal wirings.

5. The analog-to-digital conversion circuit according to claim 1, further comprising
a third signal wiring configured to supply a plurality of bit values of the digital signal to the plurality of first signal wirings, and
a second buffer connected to the third signal wiring.

6. An imaging apparatus comprising:
an analog-to-digital conversion circuit; and
a plurality of pixels, each configured to output an analog signal based on a photoelectric conversion to the analog-to-digital conversion circuit, wherein
the analog-to-digital conversion circuit comprises:
a plurality of comparators, each configured to output a comparing result signal indicating a result of comparing an analog signal with a reference signal having a signal level changing with elapse of time;
a plurality of memories, each arranged correspondingly to one of the plurality of comparators;
a counter configured to generate a count signal having a plurality of bits in Gray code by counting a clock signal; and
a plurality of first signal wirings, each configured to transmit one of the plurality of bits of the count signal from the counter to the plurality of memories, wherein
each of the plurality of memories holds the count signal according to a signal level change of the comparing result signal of corresponding one of the plurality of comparators, to convert the analog signal to a digital signal, and wherein
each of the plurality of memories has a plurality of bit memories, each storing one bit of the plurality of bits, the analog-to-digital conversion circuit further comprises a plurality of second signal wirings, each connecting between the bit memories of the plurality of memories, each of the plurality of second signal wirings is connected to one of the plurality of first signal wirings, and the plurality of first signal wirings and/or the plurality of second signal wirings include a signal wiring transmitting a signal of least significant bit in the count signal arranged between the other signal wirings each transmitting a signal of a bit different from the least significant bit in the count signal.

7. The imaging apparatus according to claim 6, wherein each of the plurality of pixels has an output portion for outputting the analog signal, the output portion of each of the plurality of pixels outputs, as the analog signal, a photoelectric conversion signal based on an incident light and a reset signal to be outputted by a reset of the output portion, respectively, each of the plurality of memories has a first memory for holding a digital signal converted from the reset signal, and a second memory for holding a digital signal converted from the photoelectric conversion signal.

8. The imaging apparatus according to claim 7, wherein the plurality of first signal wirings corresponding to the first and second memories includes:

the signal wiring transmitting the signal of the least significant bit of the count signal arranged in a center; and the other signal wirings each transmitting the signal of the bit different from the least significant bit of the count signal are arranged at both sides of the signal wiring transmitting the signal of the least significant bit.

9. The imaging apparatus according to claim 8, wherein each of the first and second memories includes the plurality of bit memories, the plurality of first signal wirings corresponding to the first and second memories includes:

the signal wiring transmitting the signal of the least significant bit arranged in a center, and the other signal wirings arranged in ascending order of a bit number successively from both sides of the signal wiring transmitting the signal of the least significant bit, alternately toward both of outside directions.

10. The imaging apparatus according to claim 9, wherein a length of the signal wiring transmitting the signal of the least significant bit from the counter to the bit memory of the first memory, and a length of the signal wiring transmitting the signal of the least significant bit from the counter to the bit memory of the second memory are equal.

11. An imaging system comprising:

an imaging apparatus; and an output signal processing unit configured to generate an image based on a signal outputted from the imaging apparatus, wherein the imaging apparatus comprises:

an analog-to-digital conversion circuit; and a plurality of pixels, each configured to output an analog signal by a photoelectric conversion to the analog-to-digital conversion circuit, wherein the analog-to-digital conversion circuit comprises:

a plurality of comparators, each configured to output a comparing result signal indicating a result of comparing an analog signal with a reference signal having a signal level changing with elapse of time;

a plurality of memories, each arranged correspondingly to one of the plurality of comparators;

a counter configured to generate a count signal having a plurality of bits in Gray code by counting a clock signal; and a plurality of first signal wirings, each configured to transmit one of the plurality of bits of the count signal from the counter to the plurality of memories, wherein each of the plurality of memories holds the count signal according to a signal level change of the comparing result signal of corresponding one of the plurality of comparators, to convert the analog signal to a digital signal, and wherein each of the plurality of memories has a plurality of bit memories, each storing one bit of the plurality of bits, the analog-to-digital conversion circuit further comprises a plurality of second signal wirings, each connecting between the bit memories of the plurality of memories, each of the plurality of second signal wirings is connected to one of the plurality of first signal wirings, and the plurality of first signal wirings and/or the plurality of second signal wirings include a signal wiring transmitting a signal of least significant bit in the count signal arranged between the other signal wirings each transmitting a signal of a bit different from the least significant bit in the count signal.

* * * * *